United States Patent [19]

Ito et al.

[11] Patent Number: 5,669,784

[45] Date of Patent: Sep. 23, 1997

[54] SURFACE MOUNT TYPE IC SOCKET

[75] Inventors: Toshiyasu Ito, Togane; Takeshi Nishimura, Narita, both of Japan

[73] Assignee: Yamaichi Electronics Co., Ltd., Tokyo, Japan

[21] Appl. No.: 574,135

[22] Filed: Dec. 18, 1995

[30] Foreign Application Priority Data

Dec. 16, 1994 [JP] Japan .................. 6-333907

[51] Int. Cl.⁶ .................................. H01R 13/62
[52] U.S. Cl. .................................. 439/331; 439/73
[58] Field of Search .................. 439/331, 73, 72, 439/569, 570, 566, 563, 70, 71

[56] References Cited

U.S. PATENT DOCUMENTS

| | | | |
|---|---|---|---|
| 4,144,648 | 3/1979 | Grovender | 439/331 |
| 4,433,886 | 2/1984 | Cassarly et al. | 439/71 |
| 4,511,201 | 4/1985 | Baker et al. | 439/71 |

*Primary Examiner*—Khiem Nguyen
*Assistant Examiner*—Yong Ki Kim
*Attorney, Agent, or Firm*—Wenderoth, Lind & Ponack

[57] ABSTRACT

A surface mount type IC socket comprises first and second cover retainers respectively disposed over a full length of opposing side surfaces of a socket body, and a seat piece disposed on each end of the first and second retainers and adapted to be arranged in an area in the vicinity of a lower part of each corner portion of the socket body. The seat piece is soldered to a conductive pattern on a surface of a wiring board at an area in the vicinity of the corner part of each corner portion. An engagement piece is disposed on each end of the first and second cover retainers and protrudes sidewardly from a side surface of each corner portion of the socket body. An engagement claw disposed on each corner portion of an IC presser cover formed of a conductive plate is engaged with a respective engagement element so that the cover is removably mounted on the socket body.

3 Claims, 5 Drawing Sheets

5,669,784

SURFACE MOUNT TYPE IC SOCKET

BACKGROUND OF THE INVENTION

1. Field of the Invention

This invention relates to a surface mount type IC socket, in which a socket body is surface mounted on a wiring board and an IC loaded on the socket body is held in contact with the socket body by an IC presser cover which is mounted on the socket body.

2. Brief Description of the Prior Art

Japanese Laid-Open Patent Application No. Hei 5-3064 discloses a surface mount type IC socket. As illustrated in FIG. 9, this conventional surface mount type IC socket is constructed such that a first and a second cover retainer 21, 22 are provided on opposing side surfaces of a socket body 20 such that the first and second retainers are disposed respectively on opposing side surfaces over a full length thereof, a seat piece 23 disposed on an intermediate portion of an extension of each one of the first and second cover retainers 21, 22 is disposed in superimposed relation with a lower surface of a projection piece 24 projecting from an intermediate portion of each opposing side surface of the socket body 20, the seat piece 23 is soldered to a wiring board 25, end an engagement claw 28 provided on each corner portion of an IC presser cover 27 is engageable with a lower edge of a corresponding one of engagement pieces 26 extending leftwardly and rightwardly from the seat pieces 23 of the first and second cover retainers 21, 22.

That is, the IC presser cover 27 is subjected to reactive force (upwardly-pushing force) of all contacts as a reaction of the IC being depressed. In the above-described conventional surface mount type IC socket, the upwardly-pushing force is applied to the engagement portions of the cover retainers, and this force is received by an intermediate soldering portion defined by the seat piece 23.

However, the above-described conventional surface mount type IC socket is constructed such that the upwardly-pushing force applied to opposite ends of the first and second cover retainers is applied to the intermediate soldering seat piece due to lever action. Therefore, this conventional IC socket has a problem that an excessively large peel-off force, which is larger than actually it should be, acts on the intermediate soldering seat piece.

The above conventional IC socket has a further problem that the engagement piece extending leftwardly and rightwardly form the intermediate soldering seat piece is obliged to be held in an upwardly deformed state for a long time by the upwardly-pushing force applied to end portions thereof, thereby diminishing the pressing force of the IC presser cover.

Furthermore, in order to obtain a soldering area by the seat piece, it is necessary for the conventional IC socket that projection pieces of a sufficiently large area are allowed to project from side surfaces of the socket body, and the first and second cover retainers are disposed along the side surfaces of the projecting ends of the projection pieces so that the seat piece is disposed in superimposed relation with the lower surface of each projection piece. Thus, it gives rise to a problem that the socket body must be large in size in the direction of projection of the projection piece.

Moreover, since the seat pieces occupy the central portions of the two opposing sides of the socket body by the seat piece, there is a significant limitation in extension of the wiring pattern passing through a lower position of the socket body.

SUMMARY OF THE INVENTION

It is, therefore, an object of the present invention to provide a surface mount type IC socket in which no excessive force is unduly applied.

It is another object of the present invention to provide a surface mount type IC socket in which a more reliable contact relation can be realized.

In order to achieve the above object, there is essentially provided an IC mount type IC socket comprising a first and a second cover retainer disposed over a full length of opposing side surfaces of a socket body, a seat piece disposed on each end of the first and second retainers and adapted to be arranged in an area in the vicinity of a lower part of each corner portion of a body of the socket, the seat piece being soldered to a conductive pattern on a surface of a wiring board at an area in the vicinity of a corner part of the each corner portion, an engagement piece disposed on each end of the first and second cover retainers and protruding sidewardly from a side surface of each corner portion of the socket body, an engagement claw disposed on each corner portion of an IC presser cover formed of a conductive plate being engaged with each engagement element so that the cover is removably mounted on the socket body.

Preferably, each end of the protruded engagement piece is bent inwardly of the cover to form a reinforcement piece. The protruded engagement piece may be provided with an engagement hole in which the engagement claw is engageable. Also, the seat piece is provided with a seat piece portion extending sidewardly from a side surface of each corner portion of the socket body.

According to a construction of the present invention, the soldering of the opposite ends of the first and second retainers by the seat pieces and the engagement of the IC presser cover can be made on the diagonal lines connecting the respective corners of the socket body.

In other words, the opposite ends of the first and second cover retainers are soldered to the wiring board at locations under the respective corner portions of the socket body by the seat pieces and the engagement claws arranged on the respective corner portions of the IC presser cover act on areas proximate to the corner portions. This arrangement eliminates, the problem, which occurred in the prior art, that the increased upwardly-pushing force applied to the opposite ends of the first and second cover retainers causes an excessive peel-off force. Moreover, the problem of offsetting the IC pressing force due to deformation of the opposite ends of the first and second cover retainers can effectively be solved.

In addition, since the first and second cover retainers can be disposed proximate to the side surfaces of the socket body, the socket body need not be made large in size as was the case in the prior art.

The above and other objects, characteristic features and advantages of the present invention will become more apparent to those skilled in the art by the following description of the preferred embodiment of the invention, as illustrated in the accompanying drawings.

DETAILED DESCRIPTION OF THE EMBODIMENT

Figure 1:
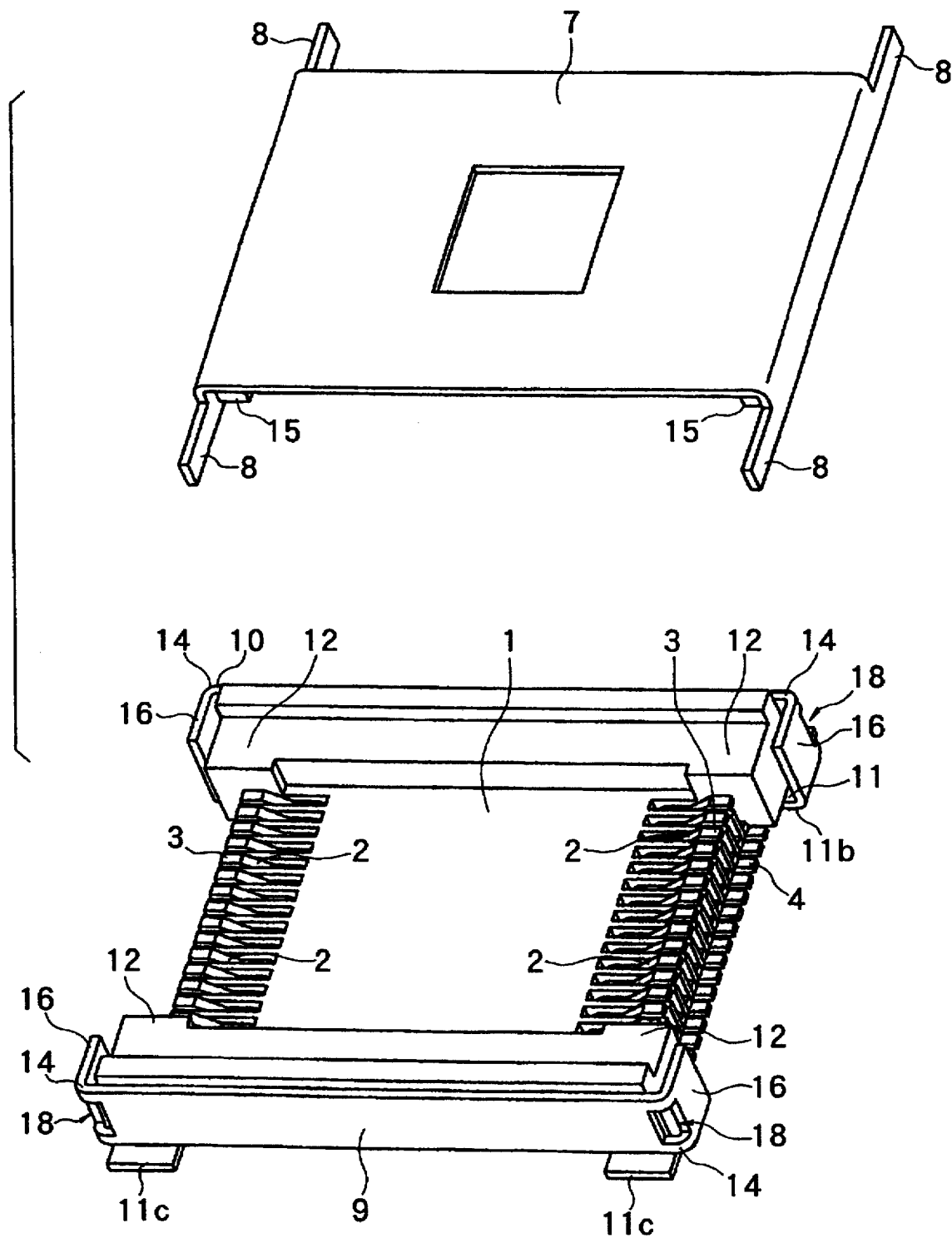
FIG. 1 is an exploded perspective view, when viewed from above, of an IC socket and an IC presser cover according to one embodiment of the present invention.

As shown in FIG. 1, etc., a socket body 1 exhibiting a generally square shape includes a plurality of surface mounting contacts 2 which are arranged in array on side edge portions of two opposing sides of the socket body.

Figure 6:
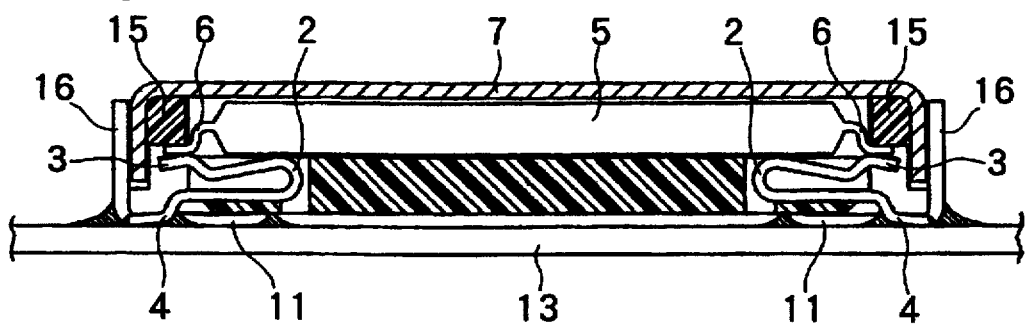
FIG. 6 is a sectional view of a contact portion, when viewed from one side, of the IC socket of FIG. 3.

As shown in FIG. 6, contacts 2 are each bent into a horizontal U-shape having an upper contact piece 3 on which a corresponding lead 6, among others, of an IC 5 is placed for achieving electrical contact, and a lower contact piece which is soldered to a pad of an end portion of a conductive pattern of a surface of a wiring board 13. By doing this, a so-called surface mount is realized.

As shown in FIGS. 1 through 4, as well as elsewhere, an IC socket of the present invention has an IC presser cover 7 as a means for urging the IC lead 6 against the upper contact piece 3 of the contact 2 in order to achieve a press-in contact state. The IC presser cover 7 is comprised of a conductive plate and has engagement claws 8 projecting respectively from four corners thereof.

The socket body 1 has a first and a second retainer 9, 10 which are disposed over the full length of the remaining two opposing sides thereof.

The first and second retainers 9, 10 are provided on opposite ends thereof with seat pieces 11 arranged immediately under respective corners of the socket body 1 and projecting generally horizontally. The respective seat pieces 11 are soldered to a conductive pattern on a surface of a wiring board 13 at areas immediately under respective corner portions 12 of the socket body 1.

Each of the first and second cover retainers 9, 10 is provided on opposite ends thereof with an engagement piece 14 protruding sidewardly (in a longitudinal direction of the cover retainer) from the side surface of each corner portion and continuous with the opposite ends of the first and second retainers 9, 10.

This engagement piece 14 allows an engagement claw 8 projecting from a corresponding corner portion of the IC presser cover 7 to removably engage therewith, and the cover 7 is removably mounted on the socket body 1.

The cover 7 is short circuited with a ground pattern on the wiring board through the retainer portions, the first and second cover retainers, and the solder on the seat piece 11, thereby exhibiting a shield effect.

The IC leads 6 projecting sidewardly from opposing side surfaces of the IC 5, for example, are pressed down by presser portions 15 such that the IC leads 6 are urged against the upper contact pieces 3 on the contacts 2. By this, the upper contact pieces 3 are deflected downwardly against the resiliency thereof, so that the IC leads 6 and the upper contact pieces 3 are contacted with each other by reaction forces of the contacts 2.

Figure 5:
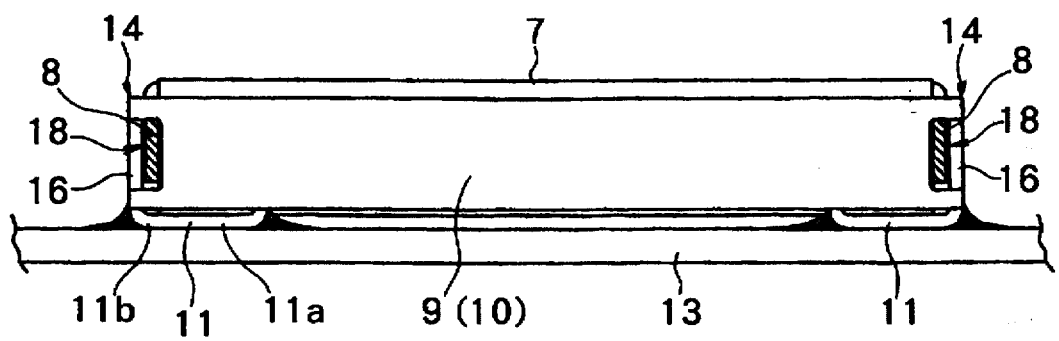
FIG. 5 is a sectional view of an engagement portion, when viewed from one side, of the IC socket of FIG. 3.

As shown in FIG. 5, as well as elsewhere, the reaction of the pressure contact is totally applied to the IC presser cover 7 as an upwardly-pushing force and then further applied to the engagement pieces 14 protruding from opposite ends of the first and second cover retainers 9, 10 through the retaining claws 8 provided on the respective corner portions of the IC presser cover 7.

Load caused by the upwardly-pushing force to be applied to the engagement pieces 14 on the opposite ends of the first and second cover retainers 9, 10 is borne by the seat pieces 11 disposed immediately under the corner portions 12 of the IC body.

In other words, soldering is made, by the seat pieces 11, on a diagonal line connecting the respective corner portions 12 of the socket body 1 and the engaging claws 8 are brought into engagement respectively with the engagement pieces 11 on the same diagonal line. The upwardly pushing force applicable to the cover 7 is applied to the soldering portion of the seat pieces 11 without being amplified.

Figure 2:
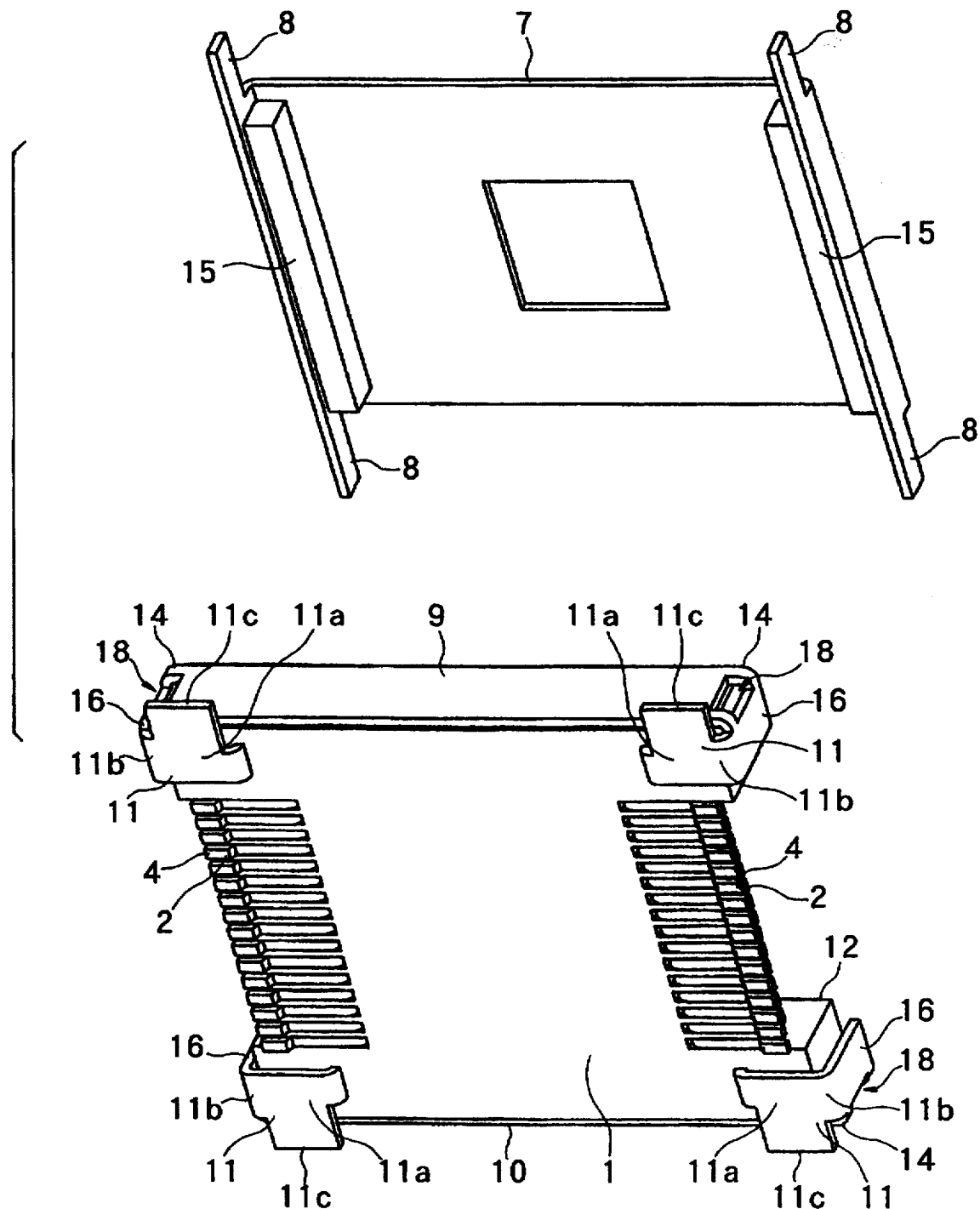
FIG. 2 is likewise an exploded perspective view of the IC socket and the IC presser cover of FIG. 1, but when viewed from below.
Figure 3:
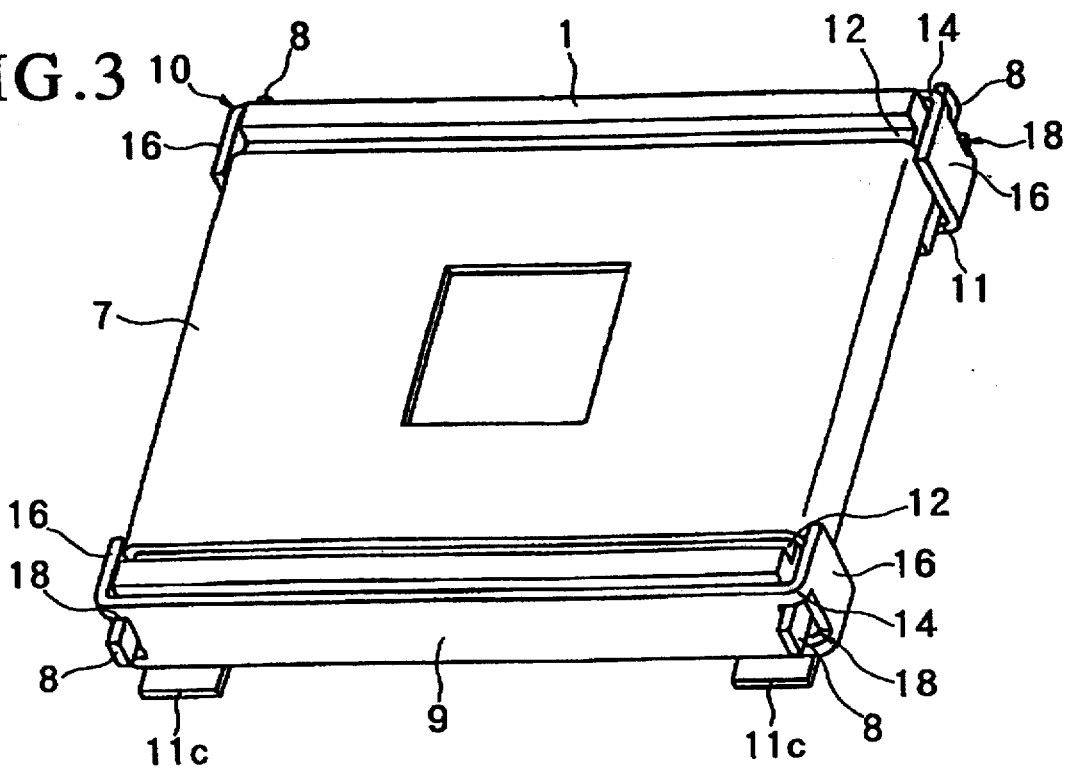
FIG. 3 As a perspective view of the above IC socket with the above IC presser cover mounted thereon.
Figure 4:
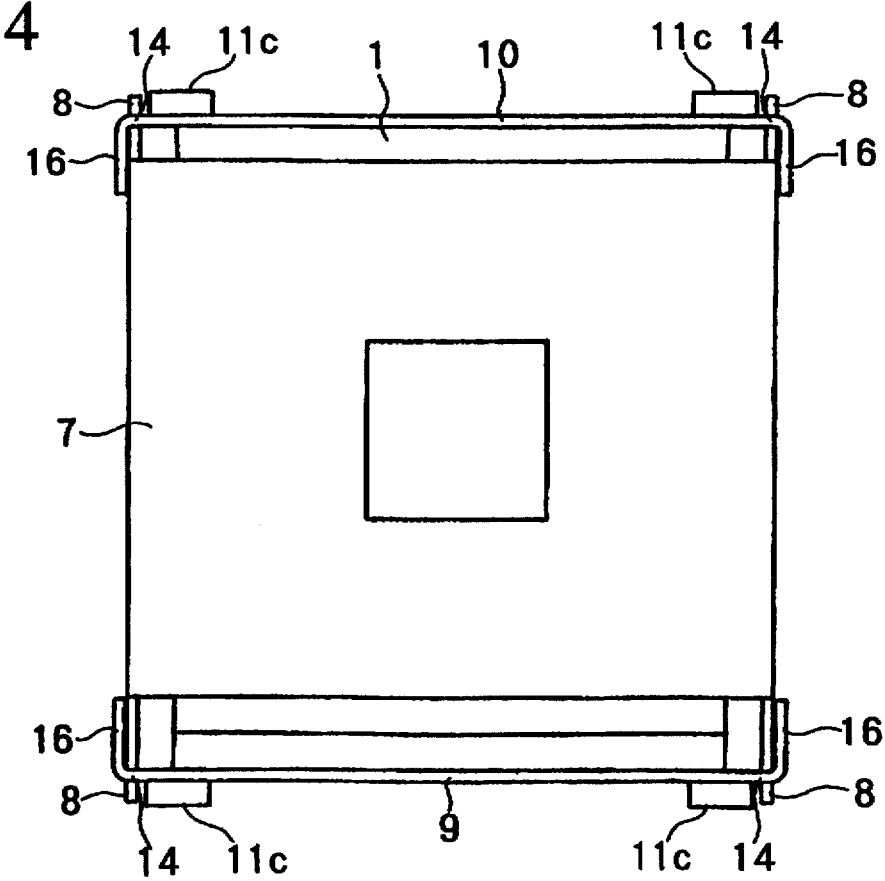
FIG. 4 is a plan view of FIG. 3.
Figure 7:
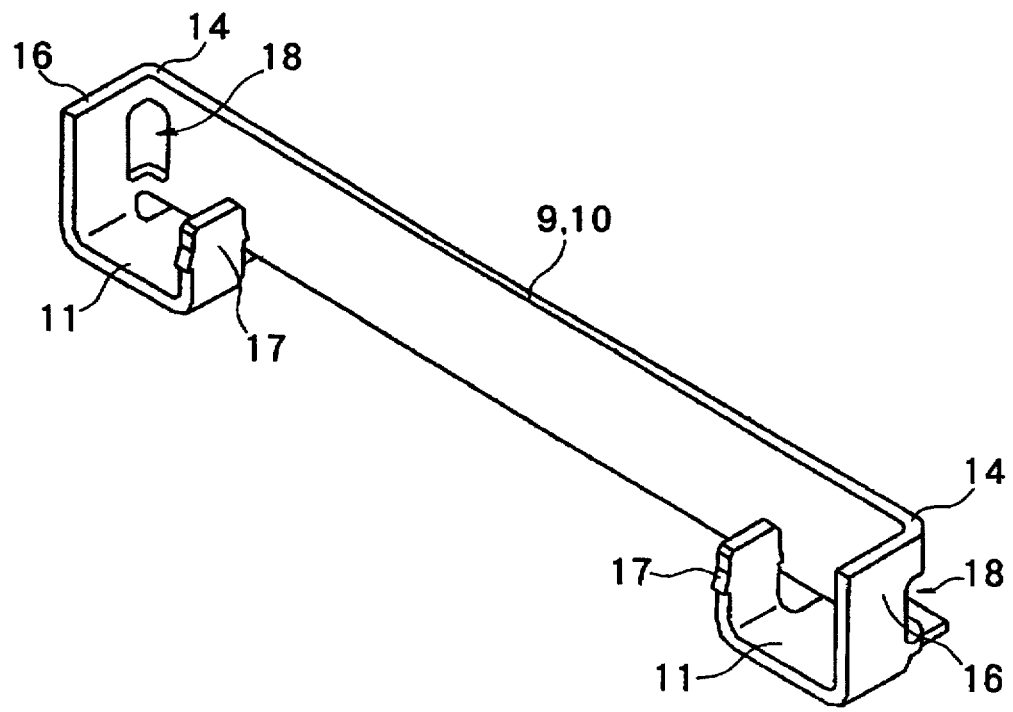
FIG. 7 is a perspective view of a first and a second cover retainer provided on the above IC socket.

More specifically, as shown in FIG. 7, as well as elsewhere, the first and second cover retainers 9, 10 are formed of an elongated metal plate which has been obtained by blanking. As shown in FIGS. 1 and 2, as well as elsewhere, the plate surfaces of the cover retainers 9, 10 are disposed along the opposing side surfaces of the socket body 1. Each of the first and second cover retainers 9, 10 is provided on opposite ends thereof with the engagement piece 14 protruding sidewardly, i.e., in a longitudinal direction of the first and second cover retainers 9, 10, from the side surface of each corner portion and continuous with the opposite ends of the first and second retainers 9, 10. Each protruded engagement piece 14 is provided with an engagement hole 18. As shown in FIGS. 3 and 4, as well as elsewhere, the engagement claws 8 projecting from the corner portions of the IC presser cover 7 are brought into engagement with the engagement holes 18, respectively and further brought into engagement with upper apertured walls, respectively, in order to oppose the upwardly-pushing force.

One end of each protruded engagement piece 14 is bent inwardly of the first and second cover retainers 9, 10 into a hook-like shape, thereby forming a reinforcement piece 16. The seat piece 11 is bent immediately under the corner portion 12 of the socket body 1 from a lower edge of the reinforcement piece 16, and this seat piece 11 is placed on and soldered to the upper surface of the wiring board.

Each seat piece 11 includes seat piece portions 11b, 11c protruding sidewardly from the side surface of the corner portion 12 of the socket body 1.

Figure 8:
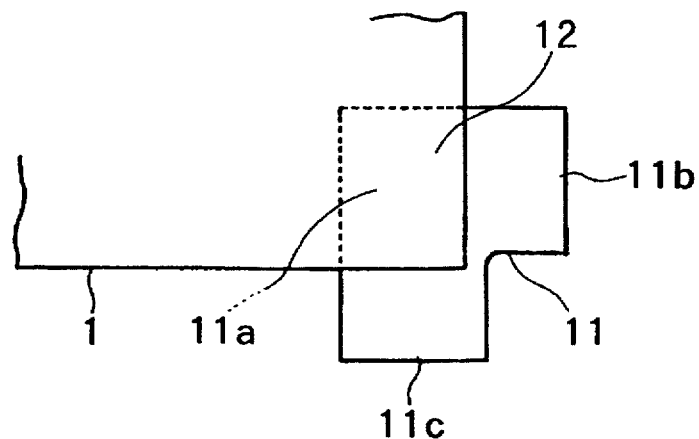
FIG. 8 is a plan view for explaining an area, where solder is to be applied, of the above IC socket.
Figure 9:
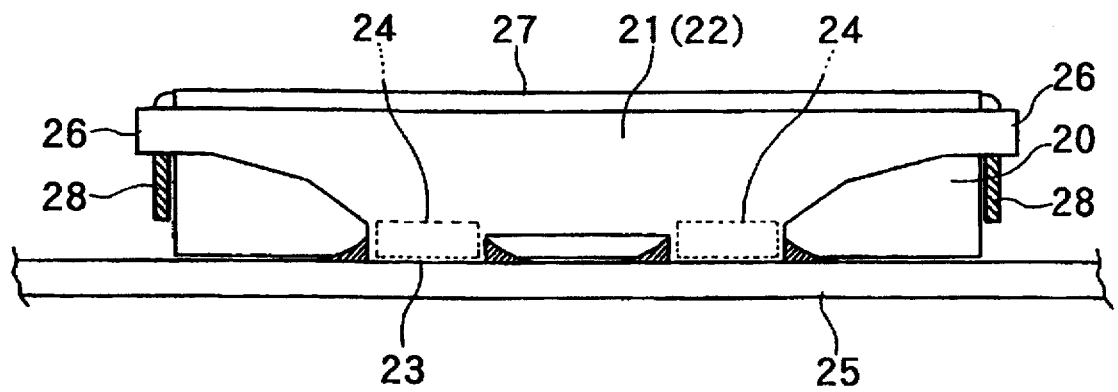
FIG. 9 is a side view for explaining a conventional way of soldering the first and second retainers.

More specifically, as shown in FIG. 8, each seat piece 11 includes a central seat piece portion 11a which is soldered to an area immediately under the corner portion 12 of the socket body 1, a protruded seat piece portion 11b protruded in a direction of the extension of the first and second cover retainers 9, 10 from the corner side surface of the socket body 1, and a protruded seat piece portion 11c protruded from the side surface of the corner portion of the socket body 1 in a direction perpendicular to a direction which crosses at right angles the direction of an extension of the first and second cover retainers 9, 10. The seat piece 11 is soldered to a conductive pattern on the surface of the wiring board through the seat pieces 11a, 11b, 11c.

Then, in the areas proximate to the corner portions to be soldered, the engagement claws 8 are brought into engagement with the engagement pieces 14 on the opposite ends of the first and second cover retainers 9, 10.

Each seat piece 11 is formed by bending the reinforcement piece 16 so that the seat piece 11 is allowed to extend under the corner portion 12 in the direction of the extension of the first and second cover retainer 9, 10. Then, each seat piece 11 is bent upwardly at its leading end to form a press-in claw 17. These press-in claws 17 are pressed into the corner portions of the socket body 1 from thereunder. By doing this, the opposite ends of the first and second cover retainers 9, 10 are integrally attached to the socket body 1.

Accordingly, the engaging portions of the IC presser cover 7 with respect to the engagement holes 18, the soldering portions of the first and second cover retainers 9, 10, and the attaching portions of the first and second cover retainers 9, 10 with respect to the socket body 1 are all concentrically arranged in the areas proximate to the corner portions of the socket body 1.

According to the present invention, the soldering portions on the opposite ends of the firs% and second cover retainers and the engaging portions of the IC presser cover with respect to the opposite ends of the first and second cover retainers are arranged at respective corner portions of the socket body, in other words, at the areas on the diagonal lines of the socket body. As a consequence, the upwardly-pushing force to be applied to the presser cover can sufficiently be borne by this arrangement. Since the upwardly-pushing force is not applied to the soldering seat pieces in an amplified manner, no excessive peel-off force is unduly applied to the soldering seat pieces. Thus, the soldering of the soldering seat pieces can be maintained in good condition, thus enabling to maintain the soldering of the IC leads to also be maintained in good condition.

Also, since the presser cover can be prevented from being deformed upwardly by the upwardly-pushing force applied to the engagement pieces on the opposite ends of the first and second retainers, a possible insufficient pressing (insufficient electrical contact) of the presser cover can positively be prevented.

Furthermore, since the first and second retainers can be disposed along the side surfaces of the socket body in an abutment relation, the socket need not be made large in size as in the case with the conventional IC socket in which the cover retainers are disposed away from the side surfaces of the socket body.

In addition, since the group of conductive patterns on the wiring board passing on the lower surface of the socket body can be allowed to extend from the four sides of the socket body, the degree of freedom in respect of the pattern design is extensively increased.

Although this invention has been described in its preferred form with a certain degree of particularity, it is understood that the present disclosure of the preferred form has been made only byway of example and that numerous changes in the details of construction and arrangement of parts may be resorted to without departing from the spirit and the scope of the invention as hereinafter claimed.

In the claims:

1. A surface mount type IC socket comprising first and second cover retainers respectively disposed over full lengths of opposing side surfaces of a socket body, a seat piece disposed on each end of each of said first and second retainers and adapted to be arranged in an area in the vicinity of a lower part of each corner portion of the socket body, each of said seat pieces being soldered to a conductive pattern on a surface of a wiring board at an area in the vicinity of one of said corner portions of the socket body, an engagement piece disposed on each end of each of said first and second cover retainers and protruding sidewardly from a side surface of each corner portion of the socket body, engagement claws disposed on respective corner portions of an IC presser cover formed of a conductive plate, each of said engagement claws being engaged with one of said engagement pieces so that said cover is removably mounted on the socket body, wherein each of said seat pieces is provided with a seat piece portion extending sidewardly from a side surface of each corner portion of the socket body.

2. A surface mount type IC socket according to claim 1, wherein an end of each of said engagement pieces is bent inwardly of said cover to form a reinforcement piece.

3. A surface mount type IC socket according to claim 1, wherein each of said engagement pieces is provided with an engagement hole in which one of said engagement claws is engageable.

* * * * *